United States Patent
Shieh et al.

[11] Patent Number: 5,988,819
[45] Date of Patent: Nov. 23, 1999

[54] SINGLE OUTPUT TRANSISTOR OUTPUT STAGE FOR INTERFACE APPLICATIONS

[75] Inventors: Sui Ping Shieh; Pirooz Parvarandeh, both of Los Altos; David Bingham, Mount Hamilton, all of Calif.

[73] Assignee: Maxim Integrated Products, Inc., Sunnyvale, Calif.

[21] Appl. No.: 09/024,859

[22] Filed: Feb. 17, 1998

[51] Int. Cl.[6] .................................................. G05F 1/10
[52] U.S. Cl. .......................................... 357/537; 327/378
[58] Field of Search .................................. 327/534, 537, 327/437, 378

[56] References Cited

U.S. PATENT DOCUMENTS

| | | | |
|---|---|---|---|
| 4,837,460 | 6/1989 | Uchida | 307/296.8 |
| 4,847,522 | 7/1989 | Fuller et al. | 326/58 |
| 5,241,502 | 8/1993 | Lee et al. | 365/203 |
| 5,300,835 | 4/1994 | Assar et al. | 307/475 |
| 5,414,314 | 5/1995 | Thurder . | |
| 5,440,244 | 8/1995 | Richter et al. | 326/37 |
| 5,444,397 | 8/1995 | Wong et al. | 326/81 |
| 5,455,732 | 10/1995 | Davis | 361/90 |
| 5,514,893 | 5/1996 | Miyanaga et al. | 257/360 |
| 5,574,389 | 11/1996 | Chu | 326/81 |
| 5,689,209 | 11/1997 | Williams et al. | 327/425 |
| 5,748,019 | 5/1998 | Wong et al. | 327/170 |
| 5,821,800 | 10/1998 | Le et al. | 327/333 |

FOREIGN PATENT DOCUMENTS

| | | |
|---|---|---|
| 0 305 937 A1 | 3/1989 | European Pat. Off. . |
| 0 556 605 A2 | 8/1993 | European Pat. Off. . |
| 0 621 692 A2 | 10/1994 | European Pat. Off. . |

*Primary Examiner*—Terry D. Cunningham
*Assistant Examiner*—Maria Hasanzadah
*Attorney, Agent, or Firm*—Blakely, Sokoloff, Taylor, Zafman LLP

[57] ABSTRACT

An interface output stage includes a pull-up circuit and a pull-down circuit connected to a positive power supply signal line having a first voltage, an output signal line having an output voltage and a negative power supply signal line having a second voltage. The pull-up circuit includes a single output transistor and a body snatcher circuit, both interconnected between the positive power supply signal line and the output signal line. The body snatcher circuit ties the bodies of the output transistor and the transistors forming the body snatcher circuit to either the first voltage or the output voltage. The pull-down circuit is designed generally similar to the pull-up circuit to tie bodies of its transistors to either the output voltage or the second voltage.

27 Claims, 3 Drawing Sheets

SINGLE OUTPUT TRANSISTOR OUTPUT STAGE FOR INTERFACE APPLICATIONS

BACKGROUND OF THE INVENTION

1. Field of the Invention

The present invention relates generally to the field of digital communications, and particular to communications interface circuitry.

2. Related Art

Various communication interface standards have been created for establishing a common communications scheme between computers and peripheral devices. For example, RS-232 serial communication interface standard has been widely used in many applications, including personal computers. Moreover, RS-485 serial communication interface standard has provided a more robust connection to support higher communication speeds and longer cables.

Normally, these and other serial communication interface standards were created for and relied upon power supply voltages of approximately five volts (5V). However, over the past few years, many electronic devices have been designed to utilize lower power supply voltages. As one illustrative example, portable computers have been manufactured with internal power supplies providing approximately 3V.

As a result, traditional output stages have been unable to drive various types of serial communication links (e.g., RS-232 and RS-485 communications) at these lower power supply voltages. The reason is that devices, connected to the serial communication link and operating at higher supply voltages, occasionally require an output to be driven above and/or below the power supply rails. Thus, it has been necessary to implement a high swing interface output stage which would allow the output of an electronic device to be appropriately driven.

Referring now to FIG. 1 and described in U.S. Pat. No. 5,414,314 assigned to the Assignee of the present application, an integrated Complementary Metal-Oxide-Semiconductor (CMOS) high swing interface output stage 100 is shown. The interface output stage 100 utilizes three P-channel devices P10, P11 and P15 and three N-channel devices N12, N13 and N14. Two of the three P-channel devices P10 and P11 are connected in series between a positive power supply terminal 110 and an output of the interface 120 while N-channel devices N12 and N13 are connected in series between the output of the interface 120 and a negative power supply terminal 130.

As described, this conventional high swing interface output stage 100 poses a number of disadvantages. One disadvantage is that this output stage 100 utilizes two output transistor pairs (P10,P11) and (N12,N13) in series. These transistors collectively occupy a substantial percentage of die area, and more than one-half of the die size in some cases. Hence, it would be desirable to replace each series of output transistor pairs with a single output transistor in order to save die area.

SUMMARY OF THE INVENTION

A circuit and methods for reducing the amount of die area utilized by an interface output stage. The interface output stage includes a pull-up circuit and a pull-down circuit connected to a positive power supply signal line, an output signal line and a negative power supply signal line. The pull-up circuit includes a single output transistor interconnected between the positive power supply signal line and the output signal line while the pull-down circuit includes a single output transistor interconnected between the negative power supply signal line and the output signal line. Both the pull-up circuit and the pull-down circuit include a body snatcher circuit which is used to provide a higher or lower of two potentials to bodies of the transistors forming the body snatcher circuit and its corresponding output transistor. The circuit and method of operation are described in detail in the following discussion.

BRIEF DESCRIPTION OF THE DRAWINGS

The features and advantages of the present invention will become apparent from the following detailed description of the present invention in which.

DETAILED DESCRIPTION OF THE PREFERRED EMBODIMENT

In the description herein, various terms are used to describe certain architecture or characteristics of the present invention. For example, a "signal line" is generally defined as any electrical carrying medium such as one or more electrical wires, bus traces, and the like.

Moreover, P-channel transistors are designated with a legend having the letter "P" followed by a specific numeral. N-channel transistors are similarly designated but with a legend having the letter "N". It is contemplated, however, bipolar transistors may be substituted for a P-channel transistor or a N-channel transistor.

Figure 1:
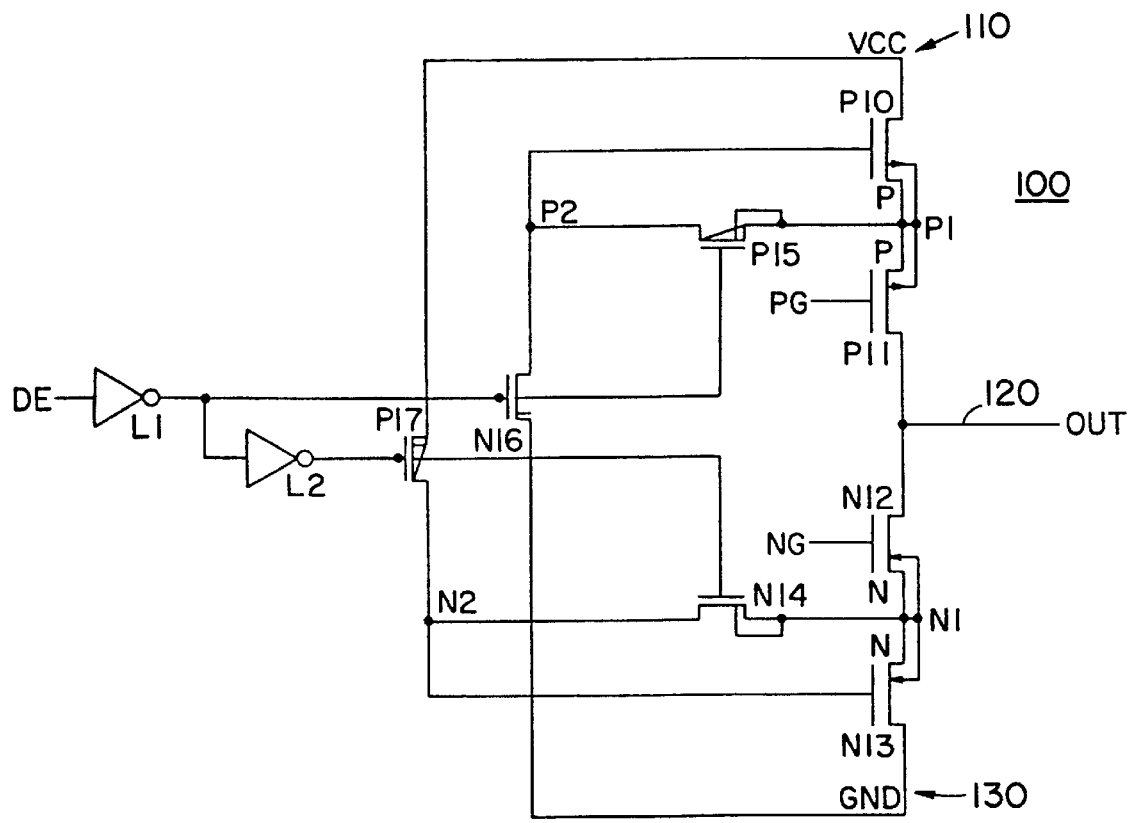
FIG. 1 is a circuit diagram of a prior high swing interface output stage.
Figure 2:
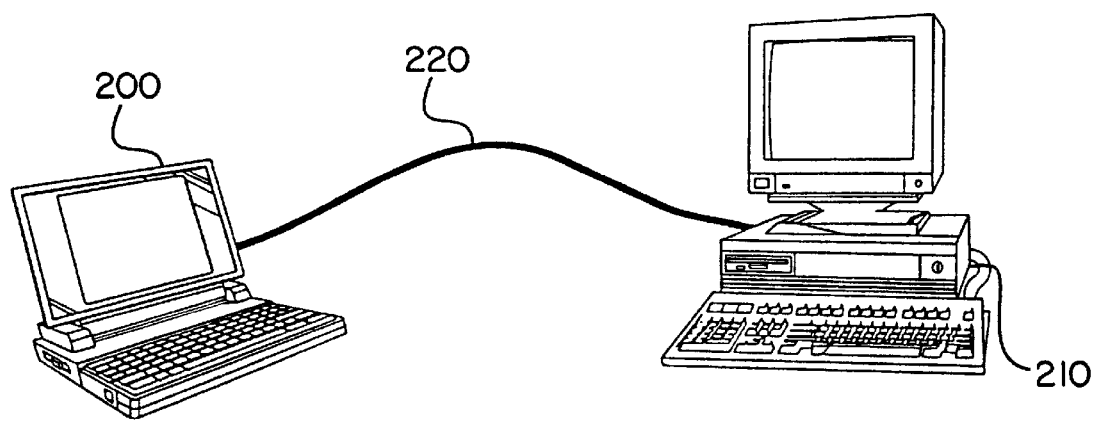
FIG. 2 is a block diagram of a system utilizing an interface output stage configured in accordance with a described embodiment of the invention.

Referring to FIG. 2, an illustration of an exemplary system including a portable computer 200 in communication with a desktop computer 210 over a serial communication signal line 220 is shown. In compliance with RS-232 serial communications standard or any other serial communications standard (e.g., RS-485, RS-422, etc.), serial communication signal line 220 can be used to establish a network connection with one or more other computers (e.g., as desktop computer 210) as shown. Alternatively, serial communication signal line 220 may be used to provide a connection with one or more peripheral devices such as a modem, printer, and various test equipment.

Portable computer 200 is adapted with a serial communication port (not shown) which provides a pathway for information transmitted to and received from serial communication signal line 220. Also not shown, a circuit referred to as an "interface output stage" is connected to a transmit (TX) lead (e.g., pin, socket, etc.) of the serial communication port to impose a voltage on a corresponding TX signal line of serial communication signal line 220. This voltage signals whether or not data is being transmitted from portable computer 200.

Figure 3:
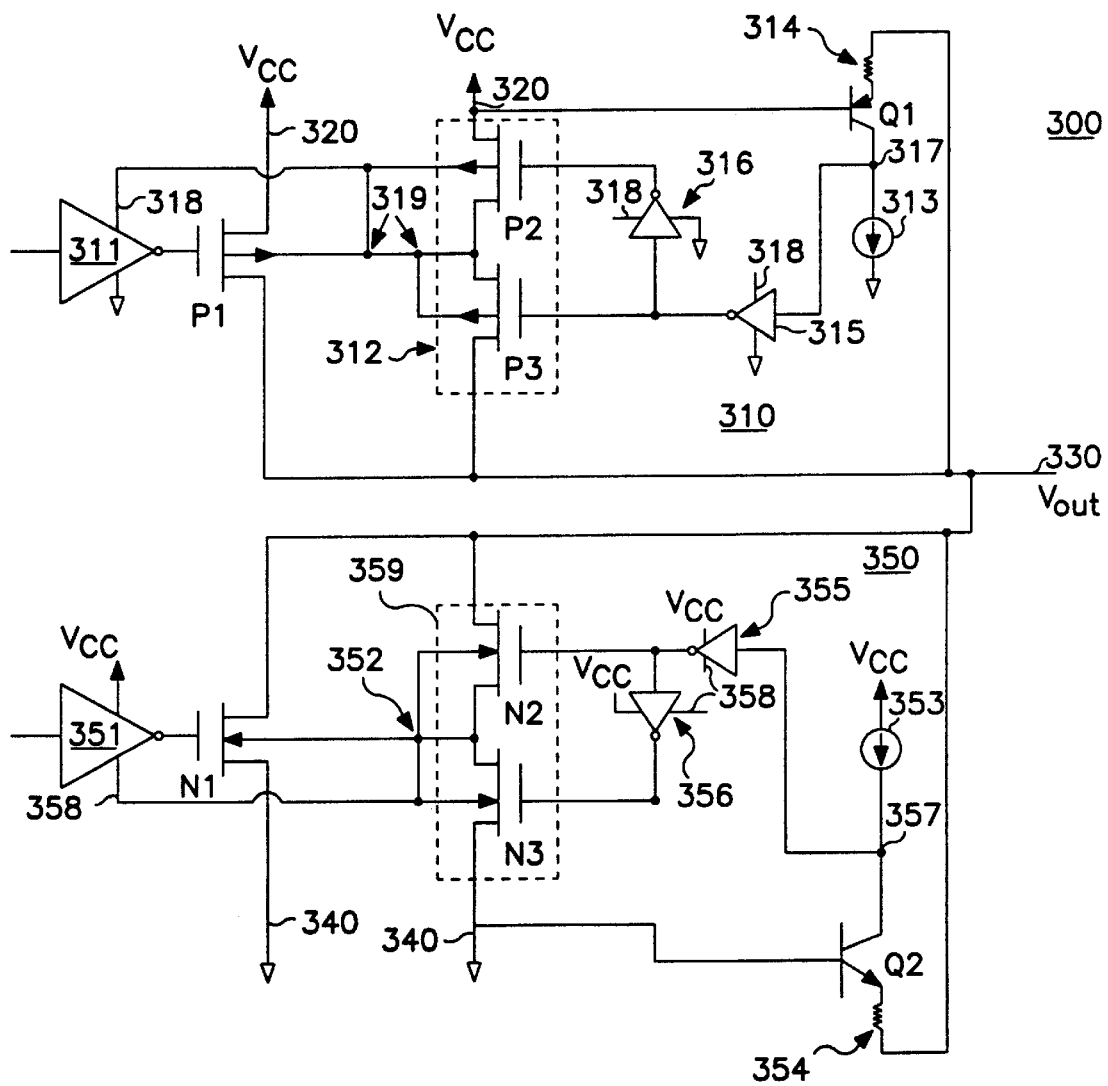
FIG. 3 is a circuit diagram illustrating the interface output stage utilized by the system of FIG. 2.

Referring now to FIG. 3, an illustrative embodiment of the interface output stage is shown. The interface output stage 300 is an integrated circuit (IC) output driver used to transmit information through a TX signal line of a serial communication port. The interface output stage 300 comprises a pull-up circuit 310 connected to both a first power supply terminal 320, namely a positive power supply signal line and an output terminal 330. Interface output stage 300 further comprises a pull-down circuit 350 connected to output terminal 330 and a second power supply terminal 340, which is a negative power supply signal line. The operations of pull-up circuit 310 and pull-down circuit 350 are mutually exclusive based on their respective inputs from transmission circuitry (not shown) and each only impose a voltage drop associated with each single Metal-Oxide-Semiconductor (MOS) output transistor. This provides substantial area reduction (e.g., a factor of 4 from a series of output transistors) and a substantial cost savings.

Referring still to FIG. 3, one embodiment of pull-up circuit 310 includes a first inverter 311, a second inverter 315, a third inverter 316, an output transistor P1, a first body snatcher circuit 312 formed by transistors P2 and P3 and a first comparison circuit. The first comparison circuit includes (i) a transistor Q1, (ii) a current source 313, and (iii) an impedance element 314. The first body snatcher circuit 312 of pull-up circuit 310 provides a higher of two potentials to bodies of output transistor P1 and translators P2 and P3 as well as a supply input of first inverter 311 via signal line 318. In this embodiment, the potentials are the voltages at the first power supply terminal 320 (measured with a positive predetermined voltage such as "Vcc") or the voltage at output terminal 330 (referred to as "Vout").

Transistors P1, P2 and P3 may be formed in a well or wells, or in the substrate of interface output stage 300. A common connection 319 connects the bodies of transistors P1, P2 and P3 together. A base of bipolar transistor Q1 is connected to first power supply terminal 320. The emitter of bipolar transistor Q1 is connected to impedance element 314 (which is connected to output terminal 330) while the collector is connected to current source 313. Preferably, current source 313 is an active current source providing a constant current flow to avoid a condition where transistors P2 and P3 are both turned-off.

Under a normal operating condition, when the voltage at first power supply terminal 320 equals or exceeds the voltage at output terminal 330 (Vcc>Vout), transistor Q1 is off. Current source 313 will hold node 317 low, which turns off transistor P3 through second inverter 315 and turns on transistor P2 through both second and third inverters 315 and 316. The second and third inverters 315 and 316 ensure that appropriate signal voltages are applied to the gates of transistors P3 and P2. As a result, the bodies associated with transistors P1, P2 and P3 are connected to the first power supply terminal 320. Also, the supply input of first inverter 311 is set to Vcc to ensure that output transistor P1 is turned-off upon applying a low voltage to a data input of first inverter 311.

More specifically, as current flows into the first comparison circuit, a comparison is made at node 317 between the amount of current through transistor Q1 and the current provided by current source 313. When the current through transistor Q1 sufficiently exceeds the current provided by current source 313, and consequently Vout is forced higher than Vcc by at least a base-emitter voltage (Vbe) of transistor Q1, transistor Q1 begins to turn on.

As a result, the voltage at node 317 will increase. This turns on transistor P3 via second inverter 315, and through second and third inverters 315 and 316, turns off transistor P2. As a result, the bodies associated with transistors P1, P2 and P3 are now connected to output terminal 330 and Vout is applied to both the bodies and the supply input of first inverter 311 controlling the gate voltage for output transistor P1. Particularly by using an active current source for current source 313 (i.e., a current source exhibiting a very high source impedance), the bodies are prevented from floating and contributing to an increase in overall noise experienced by interface output stage 300.

As further shown in FIG. 3, pull-down circuit 350 includes a fourth, a fifth and a sixth inverter 351, 355 and 356, an output transistor N1, a second body snatcher circuit 352 formed by transistors N2 and N3, and a second comparison circuit including (i) a transistor Q2, (ii) a current source 353, and (iii) an impedance element 354. Transistors N1, N2 and N3 may be formed in a well or wells or in a substrate such that each has a body connected together through a common connection 359. Second body snatcher circuit 352 of pull-down circuit 350 provides a lower of two potentials to both the body of output transistor N1 and a ground input of fourth inverter 351 via communication signal line 358. In this embodiment, the potentials are the voltage at the second power supply terminal 340 (referred to as "GND") or Vout.

Under normal operating condition when Vout>GND, transistor Q2 remains off. This places a high voltage on node 357 to turn off transistor N2 (based on the output by fifth inverter 355) and to turn on transistor N3 (based on an output by fifth and sixth inverters 355 and 356). As a result, the bodies associated with transistors N1, N2 and N3 are connected to the second power supply terminal 340; namely, GND. Also, the ground input of fourth inverter 351 is set to GND.

As current flows through transistor Q2 of second comparison circuit, a comparison is made at node 357 between the current through transistor Q2 and the current provided by the current source 353. As a result, when Vout<GND by at least a base-emitter voltage (Vbe) of transistor Q2, transistor Q2 begins to turn on. When the current through transistor Q2 exceeds the current through current source 353, node 357 will be pulled low. This turns on transistor N2 via fifth inverter 355 and turns off transistor N3 via the fifth and sixth inverters 355 and 356. As a result, the bodies associated with transistors N1, N2 and N3 are connected to output signal line 340 and Vout is applied to both these bodies and the ground input of fourth inverter 351 controlling the gate voltage of output transistor N1.

The specific embodiments set forth above are intended merely to demonstrate one implementation of the invention and should not be viewed as limiting its scope. Other implementations and embodiments of the invention will be readily apparent to those skilled in the art. Therefore, the scope of protection should be construed from the following claims.

What is claimed is:

1. A high swing interface output stage comprising:

a plurality of signal lines including an output terminal and a power supply terminal;

a comparison circuit coupled to the output terminal and the power supply terminal for comparing a voltage provided on the power supply terminal with a voltage provided on the output terminal;

a first transistor coupled to the output terminal and the power supply terminal to drive the voltage of the power supply terminal onto the output terminal when the first transistor is ON in response to a data input signal and for allowing the voltage on the output terminal to swing above or below the voltage on the power supply terminal without loading the output terminal when the first transistor is OFF, the first transistor having a body; and a body snatcher coupled to the first transistor and the comparison circuit, the body snatcher circuit responsive to the comparison circuit by coupling the body of the first transistor to one of the output terminal and the power supply terminal to allow the voltage on the output terminal to swing above or below the voltage of the power supply terminal when the first transistor is OFF.

2. The high swing interface output stage of claim 1, wherein the body snatcher circuit comprises:
a second transistor coupled to the power supply terminal, the body of the first transistor and the comparison circuit; and
a third transistor coupled to the output terminal, the second transistor, the comparison circuit and the body of the first transistor.

3. The high swing interface output stage of claim 1, wherein
the power supply terminal is a positive power supply terminal,
the first transistor is a P-channel Metal-Oxide-Semiconductor (MOS) transistor to drive a positive voltage of the positive power supply terminal onto the output terminal when the P-channel Metal-Oxide-Semiconductor (MOS) transistor is ON and for allowing the voltage on the output terminal to swing above the positive voltage of the positive power supply terminal without loading the output terminal when the P-channel Metal-Oxide-Semiconductor (MOS) transistor is either ON or OFF, and
the body snatcher circuit coupling the body of the P-channel Metal-Oxide-Semiconductor (MOS) transistor to the output terminal when the voltage provided on the output terminal exceeds the positive voltage on the positive power supply terminal by at least a predetermined voltage to allow the voltage on the output terminal to swing above the positive voltage of the positive power supply terminal when the P-channel Metal-Oxide-Semiconductor (MOS) transistor is either ON or OFF.

4. The high swing interface output stage of claim 1, wherein
the power supply terminal is a negative power supply terminal,
the first transistor is an N-channel Metal-Oxide-Semiconductor (MOS) transistor to drive a voltage of the negative power supply terminal onto the output terminal when the N-channel Metal-Oxide-Semiconductor (MOS) transistor is ON and for allowing the voltage on the output terminal to swing below the voltage of the negative power supply terminal without loading the output terminal when the N-channel Metal-Oxide-Semiconductor (MOS) transistor is ON and OFF, and
the body snatcher circuit coupling the body of the N-channel Metal-Oxide-Semiconductor (MOS) transistor to the output terminal when the voltage provided on the output terminal falls below the voltage of the negative power supply terminal by at least a predetermined voltage to allow the voltage on the output terminal to swing below the voltage of the negative power supply terminal when the N-channel Metal-Oxide-Semiconductor (MOS) transistor is ON and OFF.

5. An interface output stage comprising:
a plurality of signal lines including an output terminal and a power supply terminal a comparison circuit coupled to the output terminal and the power supply terminal for comparing a voltage provided on the power supply terminal with a voltage provided on the output terminal, said comparator circuit comprising:
an impedance element;
a bipolar transistor including a base, an emitter and a collector, the base coupled to the power supply terminal and the emitter coupled to the impedance element;
a current source coupled to the collector of the bipolar transistor;
a first transistor having a body; and
a body snatcher circuit responsive to the comparison circuit to couple the body of the first transistor to one of the output terminal and the power supply terminal.

6. The interface output stage of claim 5, wherein the collector of the bipolar transistor is coupled to a gate of the second transistor and a gate of the third transistor.

7. The interface output stage of claim 5, wherein the collector of the bipolar transistor is coupled to a gate of the third transistor via at least one inverter and to a gate of the second transistor via at least two inverters.

8. The interface output stage of claim 5, wherein the body of the first transistor is coupled to the output terminal when a current through the bipolar transistor exceeds a current provided by the current source.

9. A high swing interface output stage comprising:
a plurality of signal lines including an output terminal, a first power supply terminal and a second power supply terminal;
a pull-up circuit coupled to the output terminal and the first power supply terminal, the pull-up circuit including
a first comparison circuit coupled to the output terminal and the first power supply terminal for comparing a voltage provided on the first power supply terminal with a voltage provided on the output terminal,
a first transistor coupled to the output terminal and the first power supply terminal to drive the voltage of the first power supply terminal onto the output terminal when the first transistor is ON in response to a data input signal having a high logic level and for allowing the voltage on the output terminal to swing above the voltage on the first power supply terminal without loading the output terminal, the first transistor having a body, and
a first body snatcher circuit coupled to the first comparison circuit, the first transistor, the output terminal and the first power supply terminal, the first body snatcher circuit coupling either the output terminal or the first power supply terminal to the body of the first transistor to allow the voltage on the output terminal to swing above the voltage of the first power supply terminal; and,
a pull-down circuit coupled to the output terminal and the second power supply terminal, the pull-down circuit including
a second comparison circuit coupled to the output terminal and the second power supply terminal for comparing a voltage provided on the second power supply terminal with a voltage provided on the output terminal,
a second transistor coupled to the output terminal and the second power supply terminal to drive the voltage of the second power supply terminal onto the output terminal when the second transistor is ON in response to the data input signal having a low logic level and for allowing the voltage on the output terminal to swing below the voltage on the second power supply terminal without loading the output terminal, the second transistor having a body, and a second body snatcher circuit coupled to the second comparison circuit, the second transistor, the output terminal and the second power supply terminal, the second body snatcher circuit coupling either the output terminal or the second power supply terminal to the body of the second transistor to allow the voltage on the output terminal to swing below the voltage of the second power supply terminal.

10. The high swing interface output stage of claim 9, wherein the first power supply terminal is a positive power supply terminal and the second power supply terminal is a negative power supply terminal.

11. An interface output stage comprising:
a plurality of signal lines including an output terminal, a first power supply terminal and a second power supply terminal;
a pull-up circuit coupled to the output terminal and the first power supply terminal, the pull-up circuit including
 a first comparison circuit coupled to the output terminal and the first power supply terminal for comparing a voltage provided on the first power supply terminal with a voltage provided on the output terminal,
 a first transistor having a first body, and
 a first body snatcher circuit coupled to the first comparison circuit, the first transistor, the output terminal and the first power supply terminal, the first body snatcher circuit coupling either the output terminal or the first power supply terminal to the first body of the first transistor, and
 the first comparison circuit comprising a bipolar transistor in series with a current source, the bipolar transistor of the comparison circuit including an emitter coupled to the first output terminal, a base coupled to the first power supply terminal and a collector coupled to the first body snatcher circuit; and,
a pull-down circuit coupled to the output terminal and the second power supply terminal, the pull-down circuit including
 a second comparison circuit coupled to the output terminal and the second power supply terminal,
 a second transistor having a second body, and
 a second body snatcher circuit coupled to the second comparison circuit, the second transistor, the output terminal and the second power supply terminal, the second body snatcher circuit coupling either the output terminal or the second power supply terminal to the second body of the second transistor.

12. The interface output stage of claim 9, wherein the first transistor is a P-channel Metal-Oxide-Semiconductor (MOS) transistor.

13. The interface output stage of claim 9, wherein the first body snatcher circuit comprises:
a third transistor having a body coupled to the body of the first transistor, a gate coupled to a first output of the first comparison circuit, a source terminal coupled to the first power supply terminal, and a drain terminal coupled to the body of the first transistor and the body of the third transistor, the third transistor for selectively coupling the first power supply terminal to the body of the first transistor responsive to the first comparison circuit; and
a fourth transistor having a body coupled to the body of the first transistor, the body of the third transistor, and the drain terminal of the third transistor, a gate coupled to a second output of the first comparison circuit, a drain terminal coupled to the body of the first transistor, the body of the third transistor, the body of the fourth transistor, and the drain terminal of the third transistor, and a source terminal coupled to the output terminal, the fourth transistor for selectively coupling the output terminal to the body of the first transistor responsive to the first comparison circuit.

14. The interface output stage of claim 13, wherein each of the first transistor, the third transistor and the fourth transistor are P-channel Metal-Oxide-Semiconductor (MOS) transistors.

15. An interface output stage comprising:
a plurality of signal lines including an output terminal, a first power supply terminal and a second power supply terminal;
a pull-up circuit coupled to the output terminal and the first power supply terminal, the pull-up circuit including
 a first comparison circuit coupled to the output terminal and the first power supply terminal,
 a first transistor having a body,
 a first body snatcher circuit coupled to the first comparison circuit, the first transistor, the output terminal and the first Dower supply terminal, the first body snatcher circuit for coupling either the output terminal or the first power supply terminal to the body of the first transistor, the first body snatcher circuit comprising a third transistor having a body interconnected to the body of the first transistor and a fourth transistor having a body interconnected to the body of the first transistor,
 a first inverter having an output coupled to a gate of the first transistor, and
 a supply input coupled to a common connection formed by bodies of the first transistor, the third transistor and the fourth transistor; and,
a pull-down circuit coupled to the output terminal and the second power supply terminal, the pull-down circuit including
 a second-comparison circuit coupled to the output terminal and the second-power supply terminal,
 a second transistor having a body, and
 a second body snatcher circuit coupled to the second comparison circuit, the second transistor, the output terminal and the second power supply terminal, the second body snatcher circuit coupling either the output terminal or the second power supply terminal to the body of the second transistor.

16. The interface output stage of claim 15, wherein the pull-up circuit further comprises at least two cascaded inverters in which an output from at least one of the at least two cascaded inverters is coupled to a gate of the fourth transistor and an output from the at least two cascaded inverters is coupled to a gate of the third transistor.

17. The interface output stage of claim 16, wherein the third transistor and the fourth transistor are turned on in a mutually exclusive manner.

18. The interface output stage of claim 11, wherein the current source is coupled to the collector of the transistor and a ground reference.

19. An interface output stage comprising:
a plurality of signal lines including an output terminal, a first power supply terminal and a second power supply terminal;
a pull-up circuit coupled to the output terminal and the first power supply terminal, the pull-up circuit including a first comparison circuit coupled to the output terminal and the first power supply terminal, a first transistor having a first body, and a first body snatcher circuit coupled to the first comparison circuit, the first transistor, the output terminal and the first power supply terminal, the first body snatcher circuit coupling either the output terminal or the first power supply terminal to the first body of the first transistor, the first body snatcher circuit comprising a third transistor and a fourth transistor each having a body connected to the first body of the first transistor; and, a pull-down circuit coupled to the output terminal and the second power supply terminal, the pull-down circuit including a second comparison circuit coupled to the output terminal and the second power supply terminal, a second transistor having a second body, and a second body snatcher circuit coupled to the second comparison circuit, the second transistor, the output terminal and the second power supply terminal, the second body snatcher circuit coupling either the output terminal or the second power supply terminal to the second body of the second transistor.

20. The interface output stage of claim 19, wherein the second body snatcher circuit comprises a pair of transistors each having a body connected to the second body of the second transistor.

21. A method for applying a high swing voltage to an output terminal of a high swing interface output stage without loading comprising:

interconnecting bodies of a plurality of transistors of a pull-up circuit of the interface output stage to a first power supply terminal at least when a voltage at the first power supply terminal is greater than or equal to a voltage at the output terminal; and interconnecting bodies of the plurality of transistors of the pull-up circuit to the output terminal when the voltage at the output terminal is greater than the voltage at the first power supply terminal by at least a base-emitter turn-on voltage of a first bipolar transistor.

22. A method for applying a high swing voltage to an output terminal of an interface output stage comprising:

interconnecting bodies of a plurality of transistors of a pull-up circuit of the interface output stage to a first power supply terminal at least when a voltage at the first power supply terminal is equal to a voltage at the output terminal;

interconnecting bodies of the plurality of transistors of the pull-up circuit to the output terminal when the voltage at the output terminal is greater than the voltage at the first power supply terminal by a base-emitter voltage of a first transistor;

interconnecting bodies of a plurality of transistors of a pull-down circuit of the interface output stage to a second power supply terminal line when the voltage at the output terminal is at least equal to a voltage at the second power supply terminal; and interconnecting bodies of the plurality of transistors of the pull-down circuit to the output terminal when the voltage at the second power supply terminal is greater than the voltage at the output terminal by a base-emitter voltage of a second transistor.

23. The high swing interface output stage of claim 3, wherein the predetermined voltage is a base emitter turn ON voltage for a bipolar transistor.

24. The high swing interface output stage of claim 4, wherein the predetermined voltage is a base emitter turn ON voltage for a bipolar transistor.

25. The interface output stage of claim 9, wherein the first transistor is an N-channel Metal-Oxide-Semiconductor (MOS) transistor.

26. The interface output stage of claim 9, wherein the second body snatcher circuit comprises:

a third transistor having a body coupled to the body of the second transistor, a gate coupled to a first output of the second comparison circuit, a source terminal coupled to the second power supply terminal, and a drain terminal coupled to the body of the second transistor and the body of the third transistor, the third transistor for selectively coupling the second power supply terminal to the body of the second transistor responsive to the second comparison circuit; and a fourth transistor having a body coupled to the body of the second transistor, the body of the third transistor, and the drain terminal of the third transistor, a gate coupled to a second output of the second comparison circuit, a drain terminal coupled to the body of the second transistor, the body of the third transistor, the body of the fourth transistor, and the drain terminal of the third transistor, and a source terminal coupled to the output terminal, the fourth transistor for selectively coupling the output terminal to the body of the second transistor responsive to the second comparison circuit.

27. The interface output stage of claim 26, wherein each of the first transistor, the third transistor and the fourth transistor are N-channel Metal-Oxide-Semiconductor (MOS) transistors.

* * * * *